United States Patent
Kim

(10) Patent No.: US 7,557,003 B2
(45) Date of Patent: Jul. 7, 2009

(54) MIM CAPACITOR MANUFACTURING METHOD

(75) Inventor: Bong Jun Kim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 112 days.

(21) Appl. No.: 11/640,154

(22) Filed: Dec. 15, 2006

(65) Prior Publication Data

US 2007/0145526 A1 Jun. 28, 2007

(30) Foreign Application Priority Data

Dec. 28, 2005 (KR) .................. 10-2005-0131672

(51) Int. Cl.
*H01L 21/8242* (2006.01)
(52) U.S. Cl. ..................... 438/239; 438/396
(58) Field of Classification Search ............... 257/532, 257/296, E29.343, E29.345; 438/239, 396, 438/393, 129, 250, 253, 758
See application file for complete search history.

(56) References Cited

U.S. PATENT DOCUMENTS

| 6,284,619 | B1 * | 9/2001 | Seymour et al. ............ 438/396 |
| 7,332,764 | B2 * | 2/2008 | Choi et al. ................. 257/300 |
| 2003/0067023 | A1 * | 4/2003 | Olewine et al. ............ 257/296 |
| 2006/0006441 | A1 * | 1/2006 | Park et al. ................. 257/296 |
| 2006/0071262 | A1 * | 4/2006 | Wang ......................... 257/303 |

* cited by examiner

*Primary Examiner*—Minh-Loan T Tran
*Assistant Examiner*—Selim Ahmed
(74) *Attorney, Agent, or Firm*—The Law Offices of Andrew D. Fortney; Andrew D. Fortney; Sharon E. Brown Turner

(57) ABSTRACT

Disclosed are an MIM (Metal-Insulator-Metal) capacitor and a method of manufacturing the same. The MIM capacitor includes: a lower metal layer and a lower metal interconnection on a substrate; a barrier metal layer on the lower metal layer; an insulating layer on the barrier metal layer; an upper metal layer on the insulating layer; an interlayer dielectric layer having a via hole on the lower metal interconnection; and a plug in the via hole.

18 Claims, 5 Drawing Sheets

MIM CAPACITOR MANUFACTURING METHOD

BACKGROUND OF INVENTION

1. Field of Invention

The present invention relates to a semiconductor manufacturing technology, and more particularly to an MIM capacitor useful in analog and mixed signal processing and a method of manufacturing the MIM capacitor.

2. Description of Related Art

Since thin-film capacitors, such as PIP (Poly-Insulator-Poly) capacitors, MIM (Metal-Insulator-Metal) capacitors and the like, are generally independent from bias (different from MOS capacitors or junction capacitors), the thin-film capacitors have been mainly used for analog products benefiting from precision of capacitors.

Further, there is a disadvantage in that it is difficult to manufacture MIM capacitors which have a relatively large capacitance per unit area than PIP capacitors, while there is an advantage in that the MIM capacitors have superior VCC or TCC of capacitance (depending on a voltage or temperature) relative to the PIP capacitors. For this reason, the MIM capacitors are advantageous for manufacturing precise analog products.

FIG. 1 is a sectional view of an MIM capacitor according to a related art.

In a method of manufacturing the MIM capacitor according to the related art, a dielectric layer 3 and an upper metal layer 4 are first deposited on lower metal layers 2a and 2b of a substrate 1 formed with a predetermined structure.

Then, the dielectric layer 3 and the upper metal layer 4 in an area to be formed with a capacitor are etched by using a mask (not shown), thereby forming an MIM capacitor 5.

Subsequently, an interlayer dielectric layer 6 is formed on the entire surface of the substrate 1, and following processes are then performed.

According to the related art, the structure of a completed MIM capacitor is a substantially two-dimensional structure, in which an insulating material is interposed between upper and lower metal layers.

However, since there are limitations for increasing capacitance in such a two-dimensional MIM structure, any significant increase in capacitance should solve such two-dimensional limitations.

BRIEF SUMMARY OF THE INVENTION

The present invention has been made to solve the above problem(s) occurring in the related art, and an object of the present invention is to provide an MIM capacitor for enhancing capacitance through a lower metal layer having a broader surface area (or increased surface area relative to a two-dimensional capacitor of the same unit area).

Another object of the present invention is to provide an MIM capacitor wherein the size (e.g., area) of the MIM capacitor can be reduced with the enhancement of capacitance so that the area of a capacitor in a semiconductor device can be reduced, and a method of manufacturing such an MIM capacitor.

According to one aspect of the present invention, there is provided an MIM (Metal-Insulator-Metal) capacitor, which includes: a lower metal layer and a lower metal interconnection, on a substrate; a barrier metal layer on the lower metal layer; an insulating layer on the barrier metal layer; an upper metal layer on the insulating layer; an interlayer dielectric layer having a via hole on the lower metal interconnection; and a plug in the via hole.

According to another aspect of the present invention, there is provided a method of manufacturing an MIM capacitor, which includes the steps of: forming a lower metal layer and a lower metal interconnection on a substrate; forming a barrier metal layer on the lower metal layer; forming an interlayer dielectric layer having a via hole on the lower metal interconnection; forming an insulating layer on the barrier metal layer; and forming a plug in the via hole and an upper metal layer on the insulating layer.

DETAILED DESCRIPTION OF THE INVENTION

Figure 1:
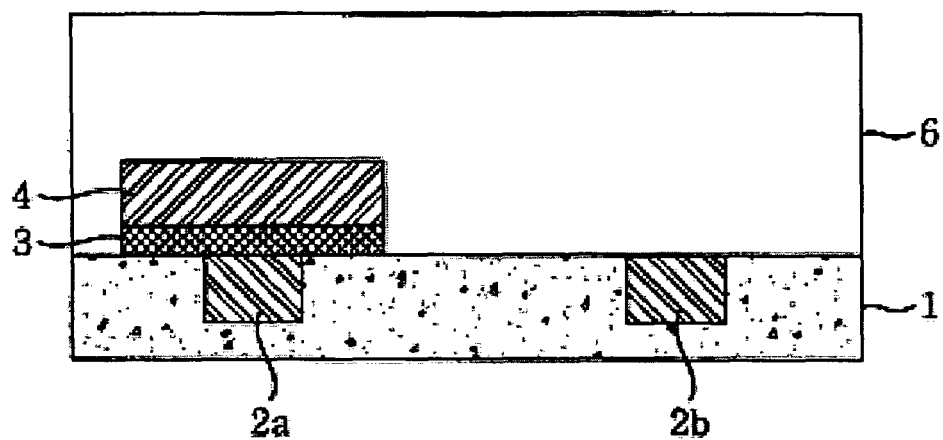
FIG. 1 is a sectional view of an MIM capacitor according to a related art.

Hereinafter, an MIM capacitor and a method of manufacturing the same according to a preferred embodiment of the present invention will be described with reference to the accompanying drawings.

In the Figures, the thickness and areas of various layers and structures may be enlarged for the purposes of illustration and/or clarity, and the same reference numerals will be used to refer to the same elements throughout the description. When layers, films, areas and plates are formed on other elements, it may not exclude other elements interposed therebetween. In contrast, if elements are directly formed on other elements, it may exclude another elements interposed therebetween.

Figure 2:
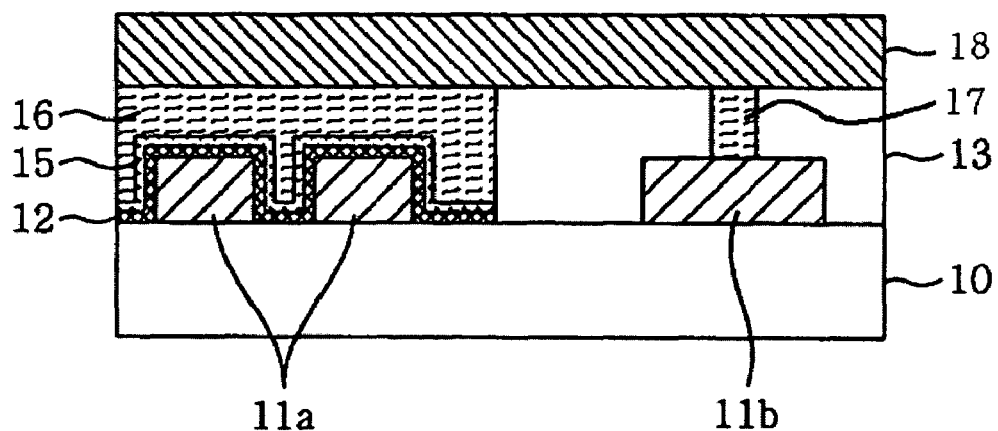
FIG. 2 is a sectional view of an MIM capacitor according to an embodiment of the present invention.

FIG. 2 is a sectional view of an MIM capacitor according to an embodiment of the present invention.

The MIM capacitor according to the embodiment of the present invention includes a lower metal layer 11a and a lower metal interconnection 11b formed on a substrate 10; a barrier metal layer 12 formed on the lower metal layer 1a; an insulating layer 15 formed on the barrier metal layer 12; an upper metal layer 16 formed on the insulating layer 15; an interlayer dielectric layer 13 having a via hole and formed on the lower metal interconnection 11b; and a plug 17 formed in the via hole.

Further, the MIM capacitor according to another embodiment of the present invention may further include an uppermost metal layer 18 formed on the upper metal layer 16 and the plug 17.

The MIM capacitor according to embodiments of the present invention has an advantage in that capacitance can be enhanced through a lower metal layer having a greater surface area by means of a barrier metal layer, which may be deposited on a patterned (or which contains a plurality of sections or portions) lower metal layer 11a.

That is, there is an advantage in that a side portion of a lower metal layer also serves to increase the lower electrode surface area of the capacitor due to the formation of a barrier metal layer thereon.

Further, according to the present invention, there is an advantage in that the size of the MIM capacitor can be reduced with the enhancement of capacitance so that an area where a capacitor occupies in a semiconductor device can be reduced.

A method of manufacturing an MIM capacitor according to an embodiment of the present invention will be described below.

FIGS. 3 to 11 are sectional views illustrating a process of manufacturing an MIM capacitor according to an embodiment of the present invention.

Figure 3:
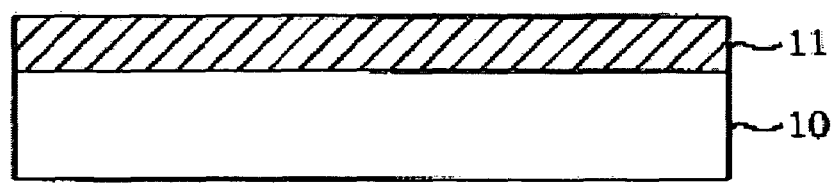
FIGS. 3 to 11 are sectional views illustrating a process of manufacturing an MIM capacitor according to an embodiment of the present invention.
Figure 4:
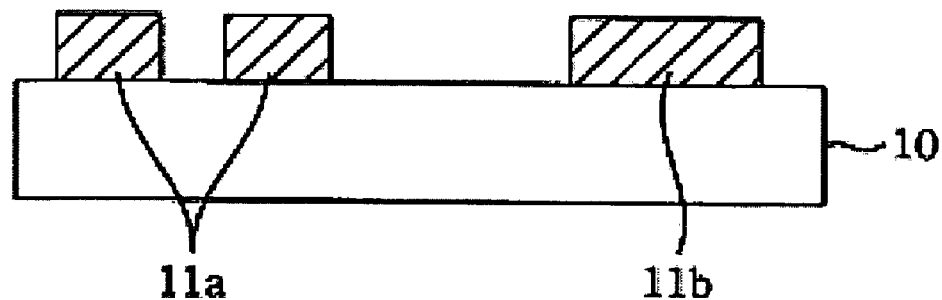

First, a metal layer 11 is deposited on a substrate 10 as shown in FIG. 3 and then patterned through a photolithography process using a photoresist, thereby forming lower metal layer 11a having an MIM capacitor lower electrode structure as shown in FIG. 4. For example, the lower electrode of the MIM capacitor may comprise a plurality of lower electrode portions 11a having a spacing between the portions sufficient for subsequent deposition of barrier metal layer 12, capacitor dielectric layer 16 and part of upper capacitor electrode 16 therein. In various embodiments, the spacing between the portions 11a of the lower metal layer may be from 0.1, 0.15 or 0.2 μm to 0.25, 0.35 or 0.5 μm. Furthermore, the metal late 11 (prior to patterning) may have a conventional thickness (e.g., from 2500, 3000 or 4000 Å to 6000, 8000 or 10,000 Å).

In this embodiment, a lower metal interconnection 11b is formed together (simultaneously) with the lower capacitor electrode metal layer 11a. For example, the lower metal layer 11a and the lower metal interconnection 11b may include an Al alloy, a layer of Ti and/or TiN, or a composite layer thereof. For example, the metal layer 11 may comprise a stacked Ti/TiN/Al-(0.5-4 wt. % Cu) alloy/Ti/TiN structure.

Figure 5:
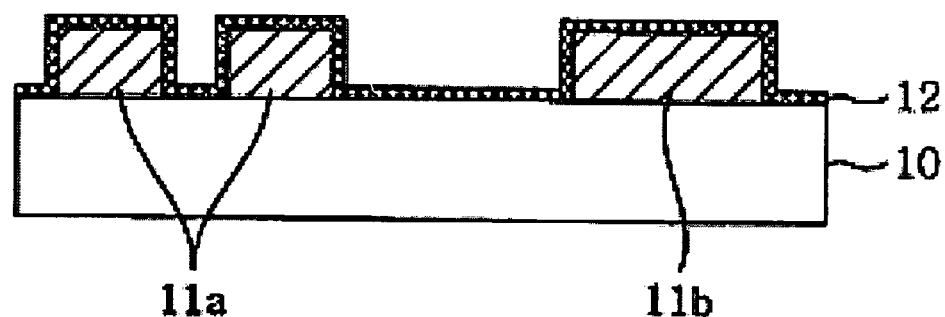
Figure 6:
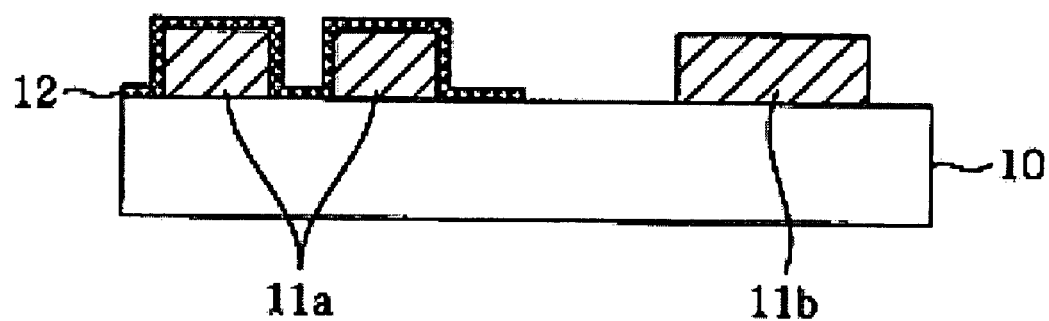

FIGS. 5 and 6 are sectional views illustrating a process of depositing a barrier metal layer 12 so as to increase capacitance.

As shown in FIG. 5, for example, a sputtering process is performed with respect to the barrier metal 12, thereby forming a Ti and/or TiN layer on the lower metal layers 11a and the lower metal interconnection 11b. In one embodiment, barrier metal 12 consists essentially of a single Ti or TiN layer. The barrier metal layer 12 may have a thickness of from 50, 100 or 150 Å to 500, 750 or 1000 Å.

Then, the barrier metal layer 12 on the lower metal interconnection is removed (generally by conventional photolithographic patterning and etching), as shown in FIG. 6.

Figure 7:
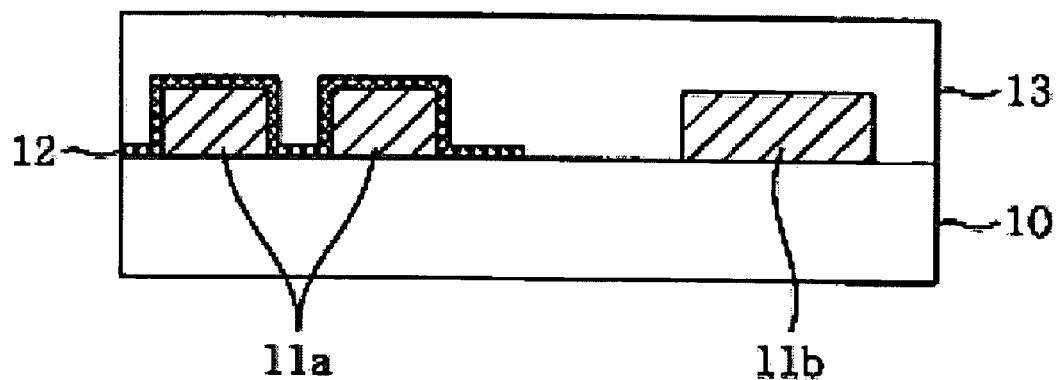

FIG. 7 is a sectional view illustrating a process of depositing an IMD (Inter Metal Dielectric) 13.

As shown in FIG. 7, the IMD 13 is deposited and planarized through a CMP (Chemical Mechanical Polishing) process.

Figure 8:
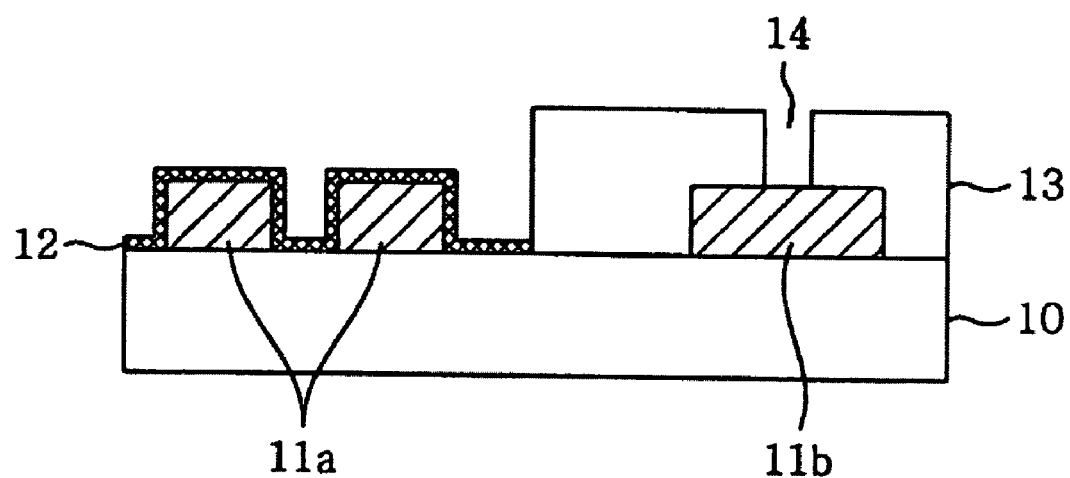
Figure 9:
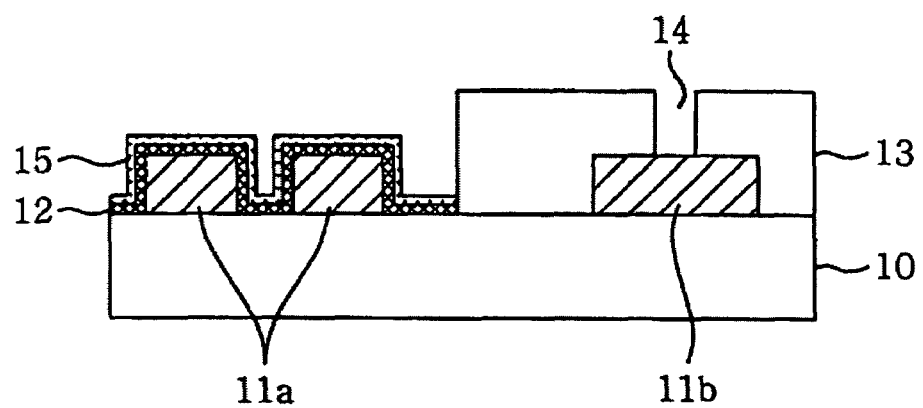

Subsequently, the IMD 13 is etched using a via mask (not shown), thereby forming a via hole 14 through which a surface of the lower metal interconnection 11b is opened, as shown in FIG. 8. In addition, the IMD 13 over the MIM lower electrode structure is removed, as shown in this figure. Precise alignment of the via mask with the edge of the barrier metal layer 12 is useful, but not critical.

Subsequently, a capacitor dielectric layer 15, for example an oxide or nitride insulating layer, is deposited on the entire substrate, including lower metal layers 11a and 11b, barrier metal layer 12, and dielectric layer 13. For example, the insulating layer 15 may comprise a SiON layer. Specifically, after forming an oxide layer by chemical vapor deposition (CVD) of silicon dioxide using TEOS or silane (SiH$_4$) and O$_3$, the SiON layer may be formed by reacting the oxide layer with NH$_3$ under a plasma atmosphere.

Then, after the insulating layer 15 is formed on the structure of FIG. 8, predetermined portions of the insulating layer 15 (e.g., over metal interconnection 11b and part of dielectric layer 13) are by patterned by photolithography and selectively etched such that the insulating layer 15 on the lower metal interconnection 11b is removed.

Figure 10:
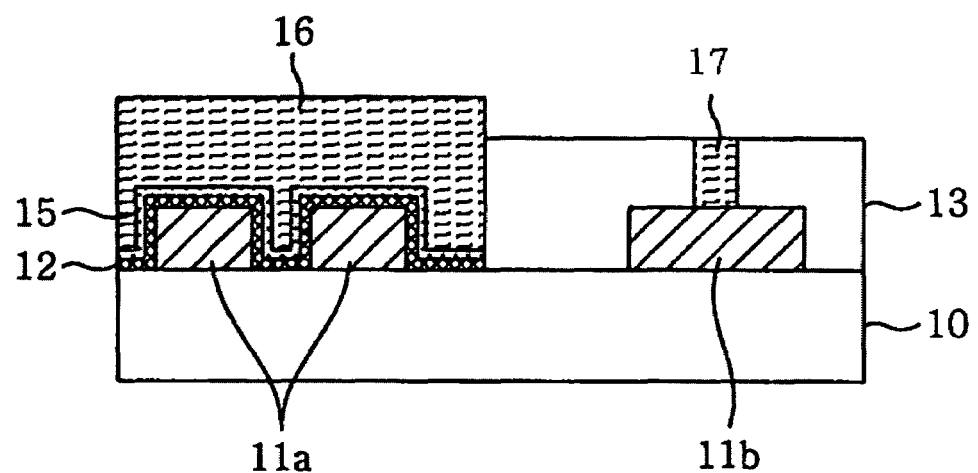

FIG. 10 is a sectional view illustrating a process of forming an upper metal layer 16 and a plug 17.

As shown in FIG. 10, a metal, e.g., tungsten is simultaneously deposited on the MIM structure and in the via hole 14 by conventional CVD, thereby forming the upper metal layer (e.g., upper capacitor electrode) 16 and the plug 17. As is known in the art, an adhesive layer (e.g., Ti metal) and a barrier layer (e.g., TiN) may be blanket-deposited (e.g., by sputtering in the case of a metal such as Ti and by sputtering in the presence of an appropriate gas-phase reactant [such as dinitrogen or ammonia] or CVD in the case of a compound such as TiN) onto the capacitor dielectric layer 15 and in the via hole 14 prior to depositing the tungsten. Thereafter, as shown in FIG. 10, the tungsten and any adhesive and/or barrier layer outside of the space for the upper capacitor electrode 16 and the via hole 14 can be removed by CMP.

Accordingly, there is formed an MIM capacitor having the lower metal layer portions 11a for a lower capacitor electrode, the insulating layer 15 as a capacitor dielectric, and the upper metal layer 16 as an upper capacitor electrode.

Figure 11:
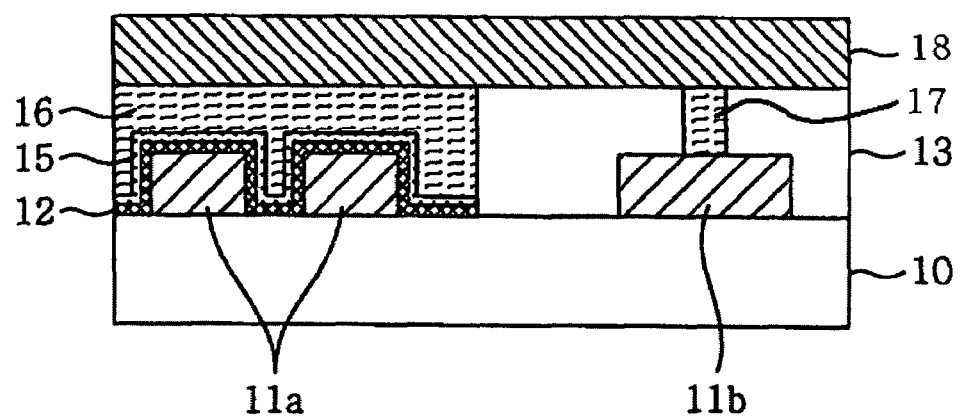

FIG. 11 is a sectional view illustrating a process of forming an uppermost metal layer 18.

As shown in FIG. 11, the resultant structure of FIG. 10 is planarized, and a metal layer is then deposited thereon and patterned, thereby forming the uppermost metal layer 18. The uppermost metal layer 18 may comprise the same metal and/ or stacked structure as metal layer 11.

In the method of manufacturing an MIM capacitor according to the embodiment of the present invention, there is an advantage in that capacitance can be enhanced through a lower metal layer having a greater surface area by means of a barrier metal layer and/or a plurality of lower electrode metal portions. That is, there is an advantage in that a sidewall portion of a lower metal layer (e.g., 11a) also serves as the lowermetal layer of a capacitor due to the formation of a barrier metal layer thereon.

Further, according to the present invention, there is an advantage in that the size of the MIM capacitor can be reduced with the enhancement of capacitance so that an area where a capacitor occupies in a semiconductor device can be reduced.

It will be apparent to those skilled in the art that various modifications and variations can be made in the present invention. Thus, it is intended that the present invention covers the modifications and variations of this invention provided they come within the scope of the appended claims and their equivalents.

The invention claimed is:

1. A method of manufacturing an MIM capacitor, the method comprising the steps of:
   forming a lower metal layer and a lower metal interconnection on a substrate;
   forming a barrier metal layer that covers a top surface and a sidewall of the lower metal layer by (1) forming the barrier metal layer on the entire surface of the substrate, including the lower metal layer and the lower metal interconnection, and (2) removing the barrier metal layer from the lower metal interconnection;
   forming an interlayer dielectric layer having a via hole on the lower metal interconnection;
   forming an insulating layer on the barrier metal layer; and
   forming a plug in the via hole and an upper metal layer on the insulating layer.

2. The method of claim 1, further comprising a step of planarizing the upper metal layer and the plug after forming the upper metal layer and the plug.

3. The method of claim 1, further comprising a step of forming an uppermost metal layer on the upper metal layer and the plug.

4. The method of claim 3, wherein the step of forming the lower metal layer and the lower metal interconnection on the substrate comprises depositing a metal layer on the substrate, selectively etching the metal layer, thereby forming a lower metal layer and a lower metal interconnection spaced apart from each other.

5. The method of claim 3, wherein the barrier metal layer includes a Ti layer and/or a TiN layer.

6. The method of claim 3, wherein the insulating layer comprises a SiON layer.

7. The method of claim 6, wherein, forming the SiON layer comprises forming an oxide layer using $O_3$, then reacting the oxide layer with $NH_3$ gas under a plasma atmosphere.

8. The method of claim 3, wherein the step of forming the interlayer dielectric layer comprises the sub-steps of:
   forming a dielectric layer on the barrier metal layer and the lower metal interconnection;
   selectively etching the dielectric layer, thereby forming a via hole over the lower metal interconnection; and
   removing the dielectric layer from the barrier metal layer.

9. The method of claim 3, wherein the lower metal layer and the lower metal interconnection include an Al alloy, a layer of Ti and/or TiN, or a composite layer thereof.

10. A method of manufacturing a MIM capacitor, comprising the steps of:
    forming a lower metal layer and a lower metal interconnection on a substrate;
    forming a barrier metal layer on the lower metal layer;
    forming a dielectric layer having a via hole on the lower metal interconnection;
    forming an insulating layer that comprises a SiON layer on the barrier metal layer by forming an oxide layer using $O_3$, then reacting the oxide layer with $NH_3$ gas under a plasma atmosphere; and
    forming a plug in the via hole and an upper metal layer on the insulating layer.

11. The method of claim 10, farther comprising planarizing the upper metal layer and the plug after forming the upper metal layer and the plug.

12. The method of claim 10, further comprising forming an uppermost metal layer on the upper metal layer and the plug.

13. The method of claim 12, wherein the step of forming the lower metal layer and the lower metal interconnection on the substrate comprises depositing a metal layer on the substrate, selectively etching the metal layer, thereby forming a lower metal layer and a lower metal interconnection spaced apart from each other.

14. The method of claim 12, wherein the step of forming the barrier metal layer comprises covering a top surface and a sidewall of the lower metal layer with the barrier metal layer.

15. The method of claim 14, wherein the step of forming the barrier metal layer on the lower metal layer comprises the sub-steps of:
    forming the baffler metal layer on the entire surface of the substrate, including the lower metal layer and the lower metal interconnection; and
    removing the barrier metal layer from the lower metal interconnection.

16. The method of claim 12, wherein the barrier metal layer includes a Ti layer and/or a TiN layer.

17. The method of claim 12, wherein the step of forming the interlayer dielectric layer comprises the sub-steps of:
    forming a dielectric layer on the barrier metal layer and the lower metal interconnection;
    selectively etching the dielectric layer, thereby forming a via hole over the lower metal interconnection; and
    removing the dielectric layer from the barrier metal layer.

18. The method of claim 12, wherein the lower metal layer and the lower metal interconnection include an Al alloy, a layer of Ti and/or TiN, or a composite layer thereof.

* * * * *